United States Patent [19]
Lakhani

[11] Patent Number: 5,912,837
[45] Date of Patent: Jun. 15, 1999

[54] BITLINE DISTURB REDUCTION

[75] Inventor: Vinod Lakhani, Milpitas, Calif.

[73] Assignee: Micron Technology, Inc., Santa Clara, Calif.

[21] Appl. No.: 08/736,858

[22] Filed: Oct. 28, 1996

[51] Int. Cl.$^6$ .................................................. G11C 11/34
[52] U.S. Cl. ............................... 365/185.02; 365/185.18
[58] Field of Search ........................... 365/185.02, 185.18

[56] References Cited

U.S. PATENT DOCUMENTS

| | | | |
|---|---|---|---|
| 4,451,905 | 5/1984 | Moyer ................................. | 365/185.02 |
| 5,077,691 | 12/1991 | Haddad ................................ | 365/185.27 |
| 5,317,535 | 5/1994 | Talreja et al. ............................ | 365/185 |
| 5,412,603 | 5/1995 | Schreck et al. ..................... | 365/189.01 |
| 5,444,664 | 8/1995 | Kuroda ................................ | 365/185.29 |
| 5,546,339 | 8/1996 | Oyama ................................ | 365/185.02 |

FOREIGN PATENT DOCUMENTS 0561271   9/1993   European Pat. Off. ........ G11C 16/04

*Primary Examiner*—A. Zarabian
*Attorney, Agent, or Firm*—Schwegman, Lundberg, Woessner & Kluth, P.A.

[57] ABSTRACT

A memory is described which uses floating gate transistors as memory cells in a memory array. The memory array has blocks of memory cells coupled to a common bitline. A voltage control circuit is described which provides reference voltages for reducing voltage disturbances in non-selected memory cells while selected memory cells are being programmed.

16 Claims, 4 Drawing Sheets

BITLINE DISTURB REDUCTION

FIELD OF THE INVENTION

The present invention relates generally to non-volatile memory devices and, in particular, the present invention relates to programming operations of flash memories.

BACKGROUND OF THE INVENTION

Non-volatile memory such as erasable programmable read-only memory (EPROM) and electrically-erasable programmable read-only memory (EEPROM) are extensively used for storing data in computer systems. EPROM and EEPROM comprise a large number of memory cells having electrically isolated gates (floating gates). Data is stored in the memory cells in the form of charge on the floating gates. Charge is transported to or removed from the floating gates by programming and erase operations, respectively.

Another type of non-volatile memory is flash memory. Flash memory is a derivative of EPROM and EEPROM. Although flash memory shares many characteristics with EPROM and EEPROM, current generation of flash memory differs in that erase operations are done in blocks.

A typical flash memory comprises a memory array which includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A conventional method of programming (or writing) a selected cell includes applying programming voltages, about 12V, to the gate of the transistor, and about 6V to the drain while the source is grounded. During programming of a selected cell in a flash memory comprising shared wordlines and bitlines, it is desirable that adjacent non-selected cells are not disturbed. However, the disturb condition often occurs since the non-selected cells, sharing the same wordline or the same bitline with the selected cell, also receive the programming voltage. The programming voltages on the wordline or the bitline of the non-selected cells cause changes in differential voltages between the gates, the sources and the drains of the field-effect transistors. The changes in the differential voltages disturb the electric fields in the transistors and, hence, disturbs the stored charge in the non-selected cells. A typical flash memory undergoes many programming cycles (at least 100,000 cycles) during its life time of approximately ten years. If the disturb condition is not reduced or corrected, at one point, the cells would not function properly and could give an inaccurate reading.

A method of reducing the disturb condition in a flash memory is disclosed in U.S. Pat. No. 5,317,535 and assigned to Intel Corporation. The Intel patent shows a method of reducing disturb condition by applying an inhibit voltage of 2.5V to the sources of non-select cells sharing the same wordline with the selected cell during programming. The inhibit voltage reduces the gap of the gate-to-source voltage of non-selected cells, and consequently reduces the disturb condition. In addition, the flash memory of the U.S. Pat. No. 5,317,535 patent is designed with shared wordlines spanning across the blocks of the memory.

In an alternate flash memory design where shared bitlines span across the blocks of the memory, a high programming voltage applied on a bitline of a selected cell during a programming operation could disturb the threshold voltages of adjacent non-selected programmed cells in non-selected blocks and cause the non-selected programmed cells to lose charge. And in some cases, the charge loss may be sufficient for the non-selected programmed cells to read as erased cells. In some other cases, this charge loss may slow down the read operation due to reduced margin. For the reasons set forth above, it will be recognized that there is need for a method to reduce the disturb condition during programming a flash memory with shared bitlines.

SUMMARY OF THE INVENTION

The present invention describes a method of reducing a disturb condition during programming a flash memory. The flash memory comprises a memory array having memory blocks and bitlines which span across the memory blocks. The advantage of the flash memory designed with memory blocks sharing bitlines is that larger memory array can be fabricated and, therefore, more bitlines can be packed in the flash memory.

In particular, the present invention describes a memory device comprising a programming voltage controller having a first programming voltage circuit connected to a gate of selected memory cells for providing a first programming voltage during a programming operation. A second programming voltage circuit connected to a drain of the selected memory cells for providing a second programming voltage during the programming operation. A third programming voltage circuit connected to sources of the selected memory cells for providing a third programming voltage during the programming operation.

The memory device also includes a reference voltage controller coupled to the programming voltage controller comprising a first reference voltage circuit connected to a gate of non-selected memory cells in non-selected blocks for providing a first reference voltage during the programming operation. A second reference voltage circuit connected to a source of the non-selected memory cells in the non-selected blocks for providing a second reference voltage during the programming operation.

A method of programming a memory device is described. The memory has memory cells fabricated as transistors. The method comprises the steps of applying a first programming voltage to a gate of memory cells to be programmed, applying a second programming voltage to a drain of the memory cells being programmed. The method also includes the steps of applying a first reference voltage to a gate of adjacent memory cells in non-selected blocks, the gate of the adjacent memory cells having a drain connected to the drain of the memory cells being programmed, and applying a second reference voltage a source of the adjacent memory cells in the non-selected blocks.

The present invention further includes method of reducing a disturb condition during programming of a flash electrically-erasable programmable read-only memory (EEPROM) having rows and columns of floating gate field-effect transistors. Each of the transistors comprises a control gate, a floating gate, a source and a drain. The drain of each of the transistors in a column is connected to a shared bitline. The method comprises the steps of receiving a programming signal, decoding address signals to identify selected transistors, applying a first programming voltage to control gates of the selected transistors, applying a second programming voltage to the drains of the selected transistors, connecting the sources of the selected transistors to ground. The method further includes the steps of applying a first reference voltage to the control gates of adjacent non-selected transistors in non-selected blocks, and applying a second reference voltage to the sources of the adjacent non-selected transistors in the non-selected blocks.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is therefore, not to be taken in limiting sense, and the scope of the invention is defined by the appended claims.

Figure 1A:
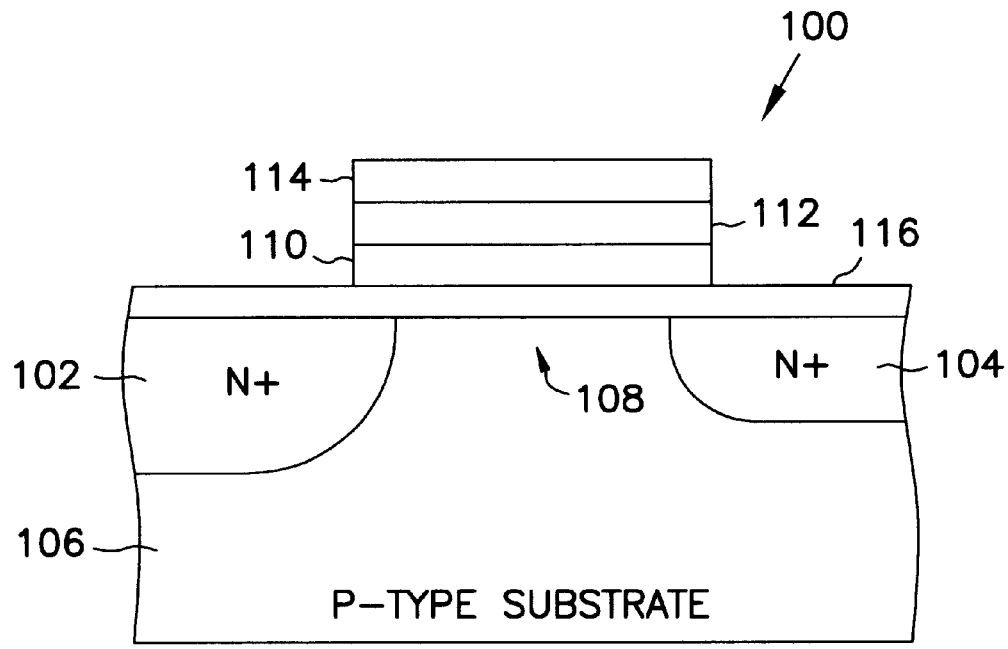
FIG. 1A is a cross-sectional view of a prior art flash memory cell.

FIG. 1A is a cross-sectional view of a typical flash memory cell. Memory cell 100 comprises a region of a source 102 and a region of a drain 104. Source 102 and drain 104 are constructed from an N+ type of high impurity concentration which are formed in a P-type semiconductor substrate 106 of low impurity concentration. Source 102 and drain 104 are separated by a predetermined space of a channel region 108. Memory 100 further includes a floating gate 110 formed by a first polysilicon (poly) layer, and a control gate 114 formed by a second poly layer. Floating gate 110 is isolated from control gate 114 by an interpoly dielectric layer 112 and from channel region 108 by a thin oxide layer 116 of approximately 100 angstrom.

Figure 1B:
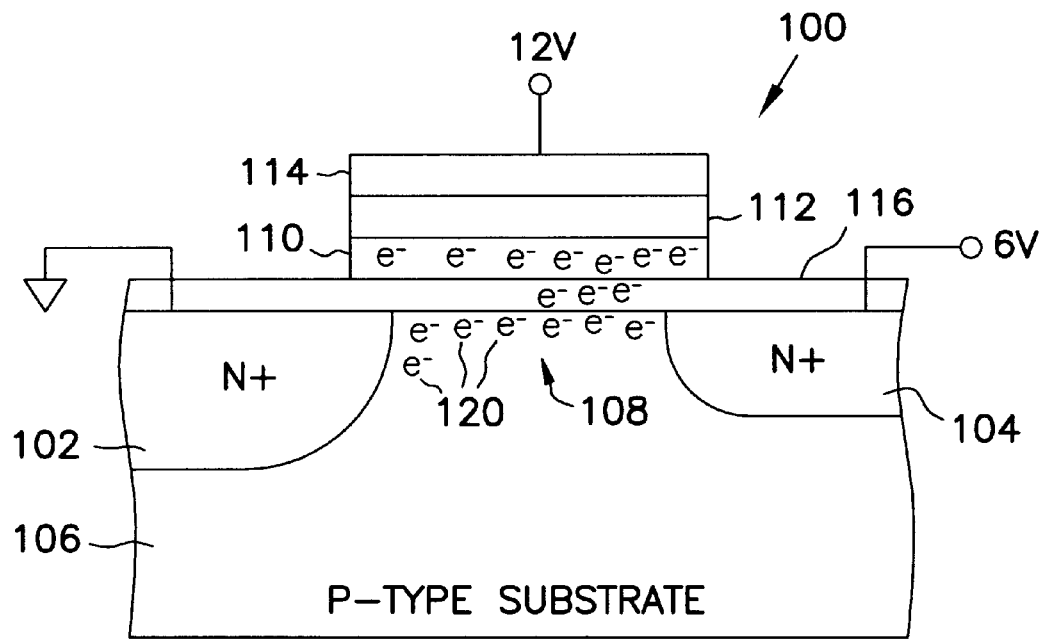
FIG. 1B is the flash memory cell of FIG. 1A during programming.

FIG. 1B is the flash memory cell of Figure 1A during a programming operation. During programming, a positive programming voltage of about 12 volts is applied to control gate 114. This positive programming voltage attracts electrons 120 from P-type substrate 106 and causes them to accumulate at the surface of channel region 108. At drain 104, the voltage is increased to about 6 volts, and source 102 is grounded. As the drain-to-source voltage increases, electrons 120 flows from source 102 to drain 104 via channel region 108. As electrons 120 travel towards drain 104, they acquire substantially large kinetic energy and are referred to as hot electrons.

The voltages at control gate 114 and drain 104 creates an electric field in oxide layer 116, this electric field attracts the hot electrons and accelerates them towards floating gate 110. At this point floating gate 110 starts to trap and accumulate the hot electrons and begins the charging process. Gradually, as the charge increases, the electric field in oxide layer 116 decreases and eventually loses it capability of attracting any more of the hot electrons to floating gate 110. At this point, floating gate 110 is fully charged. The negative charge from the hot electrons collected in the floating gate 110 raises the cell's threshold voltage (Vt) above logic 1 voltage. When control gate 114 is brought to a logic 1 during a read operation, the cell will barely turn on. Sense amplifiers are used in the memory to detect and amplify the state of the memory cell.

Figure 2:
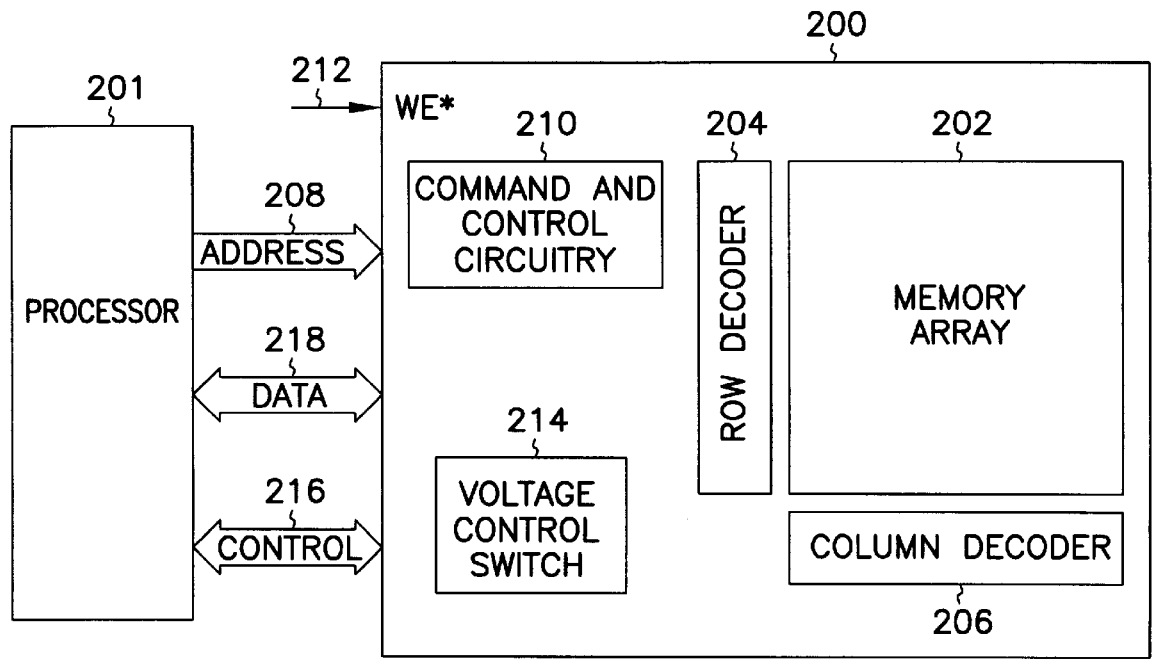
FIG. 2 is a simplified block diagram of a typical flash memory incorporating the present invention.

FIG. 2 is a simplified block diagram of a typical system having a flash memory incorporating the present invention. Memory 200 comprises a memory array 202 having memory cells. A row decoder 204 and a column decoder 206 are designed to decode and select addresses provided on address lines 208 to access appropriate memory cells. Command and control circuitry 210 is designed to control the operation of memory 200 in response to incoming command and control signals from a processor 201, including a write enable signal 212 (WE*), control lines 216 and data communication lines 218. Furthermore, a voltage control switch 214 is provided to apply appropriate voltages to the memory cells during programming operation. It will be appreciated by those skilled in the art that the memory of FIG. 2 has been simplified for the purpose of illustrating the present invention and is not intended to be a complete description.

Figure 3:
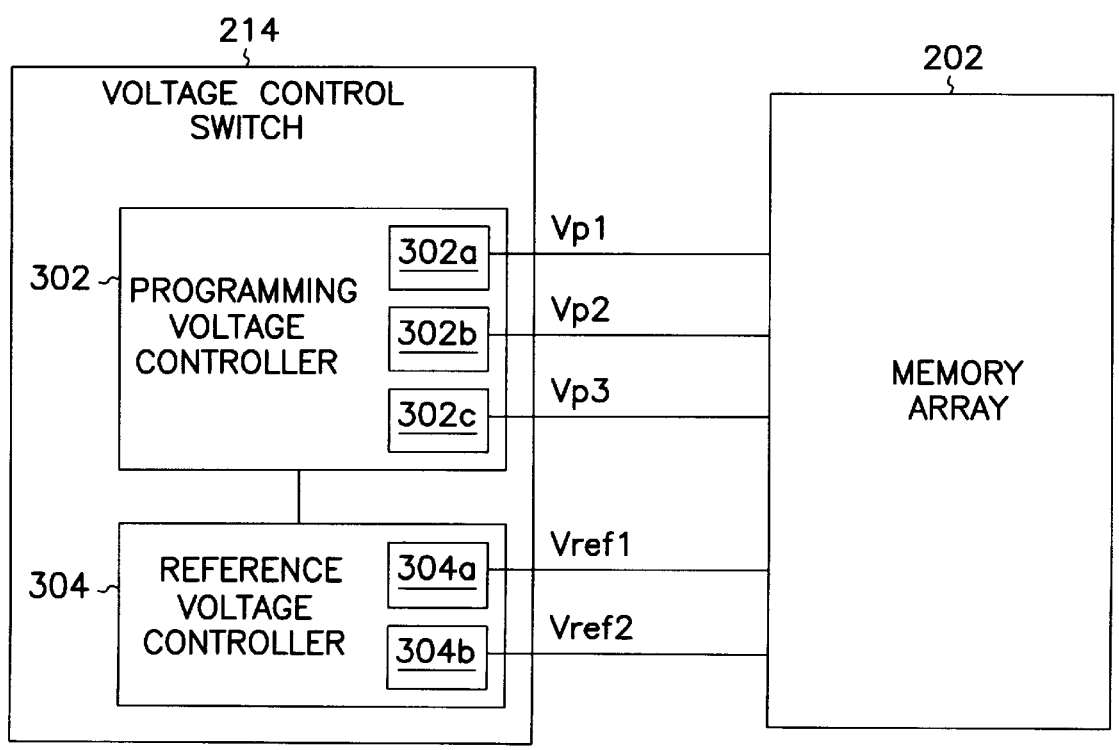
FIG. 3 is a block diagram of a voltage control switch coupling to a memory array of FIG. 2.

FIG. 3 is a block diagram of voltage control switch 214 coupling to memory array 202. Voltage control switch 214 comprises a programming voltage controller 302 having a first programming voltage circuit 302a for providing a first programming voltage Vp1, a second programming voltage circuit 302b for providing a second programming voltage Vp2, and a third programming voltage circuit 302c for providing a third programming voltage Vp3. A reference voltage controller 304 having a first reference voltage circuit 304a for providing a first reference voltage Vref1, and a second reference voltage circuit 304b for providing a second reference voltage Vref2. The programming voltages Vp1, Vp2 and Vp3, and the reference voltages Vref1 and Vref2 are used to provide appropriate voltages to memory array 202 during programming, as explained below.

Figure 4:
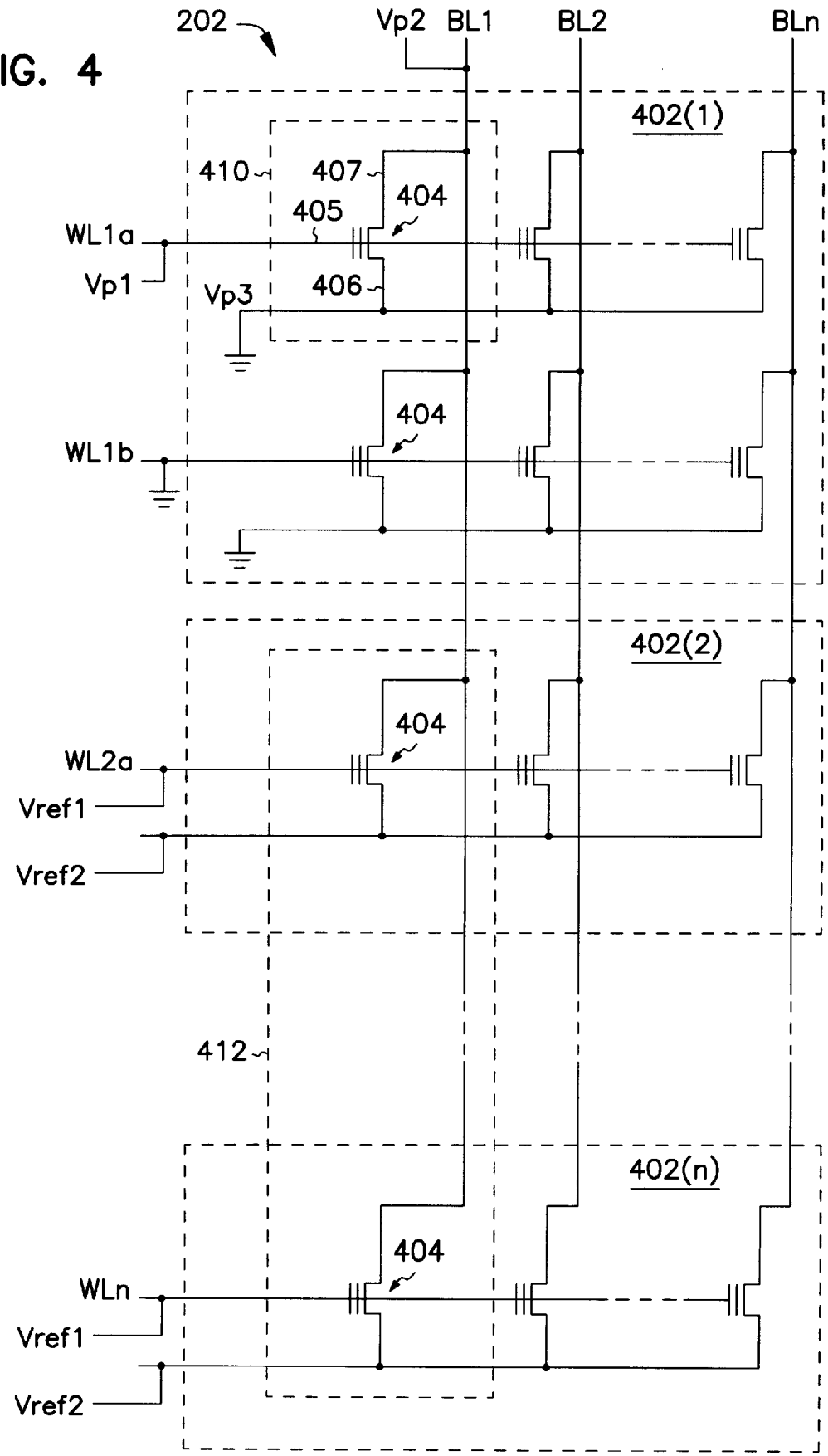
FIG. 4 is a portion of a schematic diagram of the memory array of the flash memory of FIG. 2 during programming.

FIG. 4 is a schematic diagram of a portion of memory array 202 of FIG. 2. Memory array 202 includes a plurality of memory blocks 402(1)-(n), a plurality of shared wordlines (WL1a-WLn) and a plurality of shared bitlines (BL1-BLn) spanning across the blocks. Each of the blocks 402(1)-(n) comprises a plurality of floating gates transistors 404 which have a gate 405, a source 406 and a drain 407. Within a block, sources 406 are connected together, gates 405 in the same row are coupled to a common wordline, and drains 407 in the same column share the same bitline. During programming, memory block 402(1) represents a selected block and includes a selected memory cell 410 having a selected wordline WL1a and a selected bitlines BL1. Memory block 402(2)-(n) represent non-selected blocks and includes non-selected memory cells 412 having non-selected wordlines WL2a-WLn.

Disturb Reduction Method

Referring to FIG. 3 and FIG. 4, command and control circuitry 210 receives a write enable signal 212 to start a programming operation. The address of selected cell 410 and non-selected cells 412 are decoded and selected by row-decoder 204 and column-decoder 206. The command and control circuitry 210 activates voltage control switch 214 so that appropriate voltages can be applied to selected cell 410. A first programming voltage (Vp1) is applied to selected wordline WL1a. It is preferred that Vp1 be about 10 to 12 volts, but other appropriate voltages can be used. A second programming voltage (Vp2), is placed on selected bitline BL1 while source 406 of selected cell 410 are connected to a third programming voltage (Vp3). It is preferred that Vp2 be about 4 to 6 volts and Vp3 is preferably zero volts or ground. During programming, non-selected wordline WL1b, in selected block 402(1) does not receive a programming voltage and is connected to ground.

Since selected cell 410 and non-selected cells 412 share the same bitline BL1, a programming voltage on bitline BL1 causes changes in the electric fields between the gates and the drains of transistors 404 of non-selected cells 412 and, hence, creates a disturb condition in non-selected cells 412. To reduce the disturb condition, reference voltage controller 216 applies a first reference voltage (Vref1), about 1 to 3 volts, to wordlines WL2a-WLn of non-selected cells 412. Reference voltage Vref1 reduces the effects of the programming voltage from bitline BLI on the fields across the gates and drains of transistors 404 of non-selected cells 412. Reference voltage Vref1 applied to wordlines WL2a-WLn could cause transistors 404 of the non-selected cells 412 to conduct. A second reference voltage (Vref2), about 1 to 3 volts, provided by reference voltage controller 216, therefore, is applied to the sources of the transistors 404 of non-selected cells 412 to prevent the transistors from conducting.

Figure 5A:
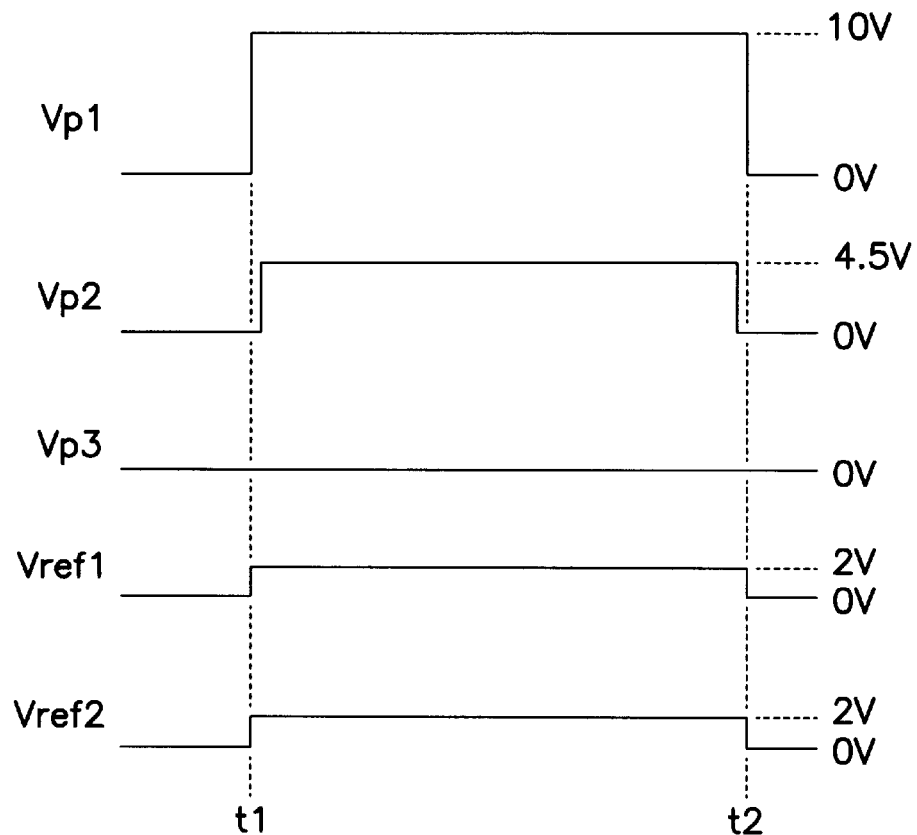
FIGS. 5A–B illustrate timing diagrams of the voltage control switch of the flash memory of FIG. 2.
Figure 5B:
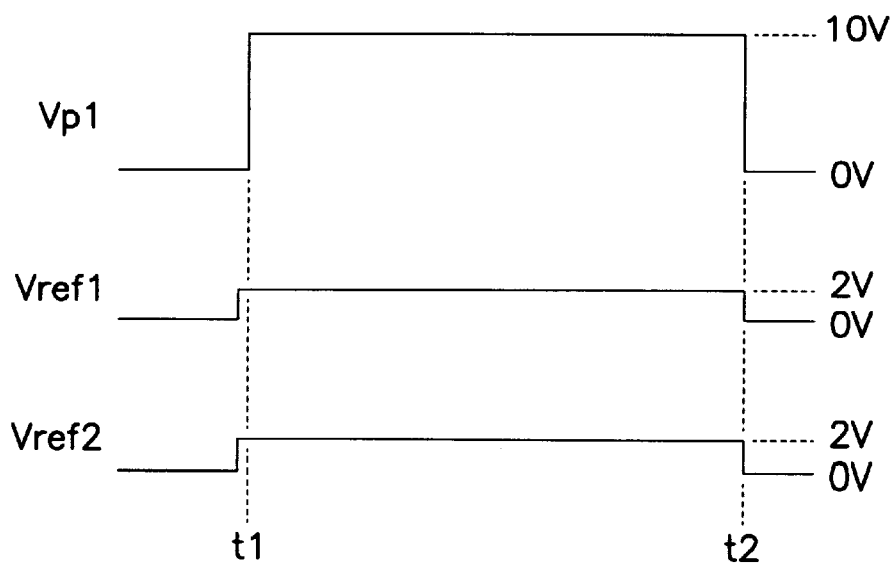

FIGS. 5A–B illustrate timing diagrams of programming voltage controller 302 and reference voltage controller 304. Referring to FIG. 3 and FIG. 5A, at the start of the programming, time t1, programming voltage controller 302 activates programming voltages Vp1, Vp2 and Vp3. At about the same time, t1, reference voltage controller 216 activates reference voltages Vref1 and Vref2. In an alternate embodiment (FIG. 5B), Vref1 and Vref2 are activated before Vp1 is activated. Vref1 and Vref2 are applied to wordlines WL2a-WLn and sources of non-selected cells 412 for as long as Vp1 is applied to wordline WL1a of selected cell 410 until the end of the programming at time t2.

Conclusion

A method for reducing a disturb condition during programming a flash memory has been described. The method comprises the steps of applying reference voltages to wordlines and sources of non-selected memory cells sharing the same bitline with selected cells being programmed.

It is to be understood that the above description is intended to be illustrative, and not restrictive. Many other embodiments will be apparent to those of skill in the art upon reviewing the above description. For example, a plurality of cells can be selected for programming. In such case, adjacent nonselected cells sharing same bitlines with the selected cells will receive, at their wordlines and sources, the reference voltages Vref1 and Vref2 respectively. The scope of the invention should, therefore, be determined with reference to appended claims, along with the full scope of equivalents to which such claims are entitled.

What is claimed is:

1. A memory device having memory blocks and memory cells comprising transistors in the memory blocks, the transistors arranged in rows and columns, each of the transistors in a column being connected to a shared bitline spanning across the memory blocks, the memory device comprising:
   a programming voltage controller comprising:
      a first programming voltage circuit coupled to gates of selected memory cells for providing a first programming voltage during a programming operation;
      a second programming voltage circuit coupled to drains of the selected memory cells for providing a second programming voltage during the programming operation;
      a third programming voltage circuit coupled to sources of the selected memory cells for providing a third programming voltage during the programming operation; and
   a reference voltage controller coupled to programming voltage controller comprising:
      a first reference voltage circuit coupled to gates of non-selected memory cells in non-selected memory blocks for providing a first reference voltage during the programming operation, the first reference voltage being different from the third programing voltage; and
      a second reference voltage circuit coupled to sources of the non-selected memory cells in the non-selected memory blocks for providing a second reference voltage during the programming operation, the second reference voltage being different from the second programming voltage and the third programming voltage, and the first programming voltage being greater than the first reference voltage and the second reference voltage.

2. The memory device of claim 1 wherein the second programming voltage is about one half of the first programming voltage.

3. The memory device of claim 1 wherein the first reference voltage and the second reference voltage are about equal.

4. A memory comprising:
   a memory array having rows and columns of memory cells;
   a plurality of wordlines connecting the rows of the memory array;
   a plurality of bitlines connecting the columns of the memory array;
   a column decoder for decoding column locations of selected memory cells in the memory array;
   command and control circuitry for controlling the memory;
   a programming voltage controller having first, second and third programming voltage circuits connected to the memory array for respectively providing first, second and third programming voltages during a programming operation;
   a reference voltage controller having first and second reference circuits coupled to the memory array for respectively providing first and second reference voltages during the programming operation, the first and second reference voltages each being different from the second programming voltage and the third programming voltage, and the first and second reference voltages each being less than the first programming voltage; and
   wherein the third programming voltage is coupled to sources of selected memory cells being programmed, and the second reference voltage is coupled to sources of non-selected memory cells of non-selected memory blocks.

5. The memory of claim 4 wherein the first programming voltage during the programming operation is coupled to gates of the selected memory cells being programmed.

6. The memory of claim 4 wherein the second programming voltage during the programming operation is coupled to drains of the selected memory cells being programmed.

7. The memory of claim 4 wherein the first reference voltage during the programming operation is coupled to gates of the non-selected memory cells having drains coupled to the drains of the selected memory cells being programmed.

8. A method of programming a memory device having memory cells comprising transistors, the method comprising the steps of:

applying a first programming voltage to gates of selected memory cells being programmed;

applying a second programming voltage to drains of the selected memory cells being programmed;

applying a third programming voltage to sources of the selected memory cells being programmed;

applying a first reference voltage to gates of non-selected memory cells of non-selected memory blocks, the non-selected memory cells each having a drain connected to the drains of the selected memory cells being programmed, the first reference voltage being different from the third programming voltage; and applying a second reference voltage to sources of the non-selected memory cells of the non-selected memory blocks, the second reference voltage being different from the second programming voltage and the third programming voltage, and the first programming voltage being greater than the first reference voltage and the second reference voltage.

9. The method of claim 8, further comprising applying the first programming voltage and the first and the second reference voltages at substantially the same time.

10. The method of claim 8, further comprising generating the second programming voltage to be about one half of the first programming voltage.

11. The method of claim 8, further comprising generating the first reference voltage and the second reference voltage to be about equal.

12. A method of programming a memory device in a processing system including a processor, the memory device having rows and columns of floating gate field-effect transistors, each of the transistors comprising a control gate, a floating gate, a source and a drain, the drain of each of the transistors in a column being connected to a shared bitline, the method comprising the steps of:

receiving at the memory device a programming signal from the processor;

decoding address signals provided from the processor to identify transistors to be programmed;

applying a first programming voltage to control gates of selected transistors to be programmed;

applying a second programming voltage to drains of the selected transistors to be programmed;

applying a third programming voltage to sources of the selected transistors to be programmed;

applying a first reference voltage to gates of non-selected transistors of non-selected memory blocks having drains connected to the drains of the selected transistors to be programmed, the first reference voltage being greater than the third programming voltage; and applying a second reference voltage to sources of the non-selected transistors of the non-selected memory blocks, the second reference voltage being greater than the third programming voltage.

13. The memory device of claim 1, wherein the second reference voltage circuit is coupled to all sources of the non-selected memory cells in the non-selected memory blocks for providing a second reference voltage during the programming operation.

14. The memory of claim 4, wherein the second reference voltage is coupled to all sources of the non-selected memory cells of the non-selected memory blocks.

15. The method of claim 8, wherein the step of applying a second reference voltage further comprises the step of applying the second reference voltage to all sources of the non-selected memory cells of the non-selected memory blocks.

16. The method of claim 13, wherein the step of applying a second reference voltage further comprises the step of applying the second reference voltage to all sources of the non-selected transistors of the non-selected memory blocks.

* * * * *

UNITED STATES PATENT AND TRADEMARK OFFICE
CERTIFICATE OF CORRECTION

PATENT NO.: 5,912,837
DATED: 6/15/99
INVENTOR(S): Lakhani et al.

It is certified that errors appear in the above-identified patent and that said patent is hereby corrected as shown below:

In column 8, line 37, delete "claim 13" and insert --claim 12--, therefore.

Signed and Sealed this

Second Day of May, 2000

Attest:

Q. TODD DICKINSON

*Attesting Officer*  *Director of Patents and Trademarks*